United States Patent
Choi et al.

(10) Patent No.: US 12,506,108 B2
(45) Date of Patent: Dec. 23, 2025

(54) COMPRESSION TYPE LASER REFLOW APPARATUS WITH VACUUM CHAMBER

(71) Applicant: LASERSSEL CO., LTD., Asan-si (KR)

(72) Inventors: Jae Joon Choi, Gwangju-si (KR); Byung Roc Kim, Incheon (KR); Eun Sung Choi, Hanam-si (KR); Hwan Soo Yeo, Asan-si (KR); Seung Hyun Seo, Cheonan-si (KR)

(73) Assignee: LASERSSEL CO., LTD., Asan-si (KR)

( * ) Notice: Subject to any disclaimer, the term of this patent is extended or adjusted under 35 U.S.C. 154(b) by 663 days.

(21) Appl. No.: 17/976,133

(22) Filed: Oct. 28, 2022

(65) Prior Publication Data

US 2023/0387069 A1    Nov. 30, 2023

(30) Foreign Application Priority Data

May 24, 2022   (KR) .......................... 10-2022-0063645

(51) Int. Cl.
    *H01L 23/00*    (2006.01)
(52) U.S. Cl.
    CPC .... *H01L 24/75* (2013.01); *H01L 2224/75102* (2013.01); *H01L 2224/75263* (2013.01); *H01L 2224/75301* (2013.01)
(58) Field of Classification Search
    CPC .......... H01L 24/75; H01L 2224/75102; H01L 2224/75263; H01L 2224/75301; H01L 2224/81224; H01L 24/00; H01L 24/11; H01L 2224/75312; H01L 2224/7565; H01L 2224/75801; H01L 2224/75821; B23K 1/0056; B23K 1/20; B23K 26/1224; B23K 26/20; B23K 1/0016; B23K 3/00; B23K 3/08; B23K 2101/36; H05K 3/3494

See application file for complete search history.

(56) References Cited

FOREIGN PATENT DOCUMENTS

| CN | 112750711 A | 5/2021 |
|---|---|---|
| JP | 2005-268565 A | 9/2005 |
| JP | 2011-84009 A | 4/2011 |
| JP | 6071122 B2 | 2/2017 |
| KR | 10-0662820 B1 | 12/2006 |
| KR | 10-2018-0137887 A | 12/2018 |
| KR | 10-2019-0100359 A | 8/2019 |
| KR | 10-2199450 B1 | 1/2021 |
| KR | 10-2021-0062376 A | 5/2021 |
| KR | 10-2022-0047596 A | 4/2022 |
| WO | 2013/023449 A1 | 2/2013 |

OTHER PUBLICATIONS

The extended European Search Report dated May 22, 2023 for corresponding European Patent Application No. 22203359.9, 8 pages.

*Primary Examiner* — Robert G Bachner
(74) *Attorney, Agent, or Firm* — Hauptman Ham, LLP

(57) ABSTRACT

The present invention relates to a laser reflow apparatus. More particularly, the present invention relates to a compression-type laser reflow apparatus with a vacuum chamber that enables mass processing by simultaneously pressuring and reflowing a plurality of electronic components by performing a laser reflow process by pressing with a light-transmitting pressing member and irradiating a laser beam inside the vacuum chamber, and that effectively prevents the generation of voids by fumes during soldering, so that the defect rate of the laser reflow process is greatly improved.

9 Claims, 12 Drawing Sheets

COMPRESSION TYPE LASER REFLOW APPARATUS WITH VACUUM CHAMBER

CROSS-REFERENCE TO RELATED APPLICATION

This application is based on and claims priority to Korean Patent Application No. 10-2022-0063645 filed on May 24, 2022, with the Korean Intellectual Property Office, the disclosures of which are incorporated herein by reference in its entirety.

TECHNICAL FIELD

The present invention relates to a laser reflow apparatus. More particularly, the present invention relates to a compression-type laser reflow apparatus with a vacuum chamber that enables mass processing by simultaneously pressuring and reflowing a plurality of electronic components by performing a laser reflow process by pressing with a light-transmitting pressing member and irradiating a laser beam inside the vacuum chamber, and that effectively prevents the generation of voids by fumes during soldering, so that the defect rate of the laser reflow process is greatly improved.

BACKGROUND ART

In industrial laser processing, micro laser processing is an applied area having a micron ($\mu$m) level precision, which is widely used in the semiconductor industry, display industry, printed circuit board (PCB) industry, and smartphone industry, etc. Memory chips used in all electronic devices have developed into a technology that minimizes circuit spacing to realize integration, performance, and ultra-high-speed communication. However, it is difficult to achieve the required technology level only by reducing the circuit line width and line width interval, so memory chips are stacked vertically. TSMC has already developed the stacking technology of up to 128 layers, and the stacking technology of up to 72 layers is being applied to mass production by Samsung Electronics, SK Hynix, etc.

In addition, technology development to mount a memory chip, a microprocessor chip, a graphic processor chip, a wireless processor chip, a sensor processor chip, etc., in one package is intensely researched and developed. A considerable level of technology has already been applied in practice.

However, in developing the technology mentioned above, since more and more electrons have to participate in the signal processing inside the ultra-high-speed/ultra-high-capacity semiconductor chip, the power consumption increases, and the issue of cooling processing for heat has been raised. In addition, to achieve the requirements of ultra-high-speed signal processing and ultra-high-frequency signal processing for more signals, a technical issue that large amounts of electrical signals must be transmitted at high speed has been raised. In addition, since the number of signal lines has to be increased, the signal interface lines to the outside of the semiconductor chip can no longer be processed with a one-dimensional lead wire method but with a ball grid array (BGA) method (also called Fan-In BGA or Fan-in Wafer-Level-Package (FIWLP)) that processes two-dimensionally from the bottom of the semiconductor chip and a method of placing a Signal Layout Redistribution Layer under the ultra-fine BGA layer under the chip and installing a second micro-BGA layer under it (also called Fan-Out BGA or Fan-Out Wafer-Level-Package (FOWLP) or Fan-Out Panel-Level-Package) have been applied.

Recently, in the case of semiconductor chips, products with a thickness of 200 $\mu$m or less, including an EMC (Epoxy-Mold Compound) layer, have appeared. To attach micron-level ultra-thin semiconductor chips with a thickness of only several hundred microns to ultra-thin PCBs, if the mass reflow (MR) process, such as the thermal reflow oven technology, which is a standard process of the existing surface mount technology (SMT), is applied, the semiconductor chip is exposed to an air temperature environment of 100 to 300 degrees (° C.) for several hundred seconds. Then, due to the difference in Coefficient of Thermal Expansion (CTE), various soldering bonding adhesion failures, such as Chip-Boundary Warpage, PCB-Boundary Warpage, Random-Bonding Failure by Thermal Shock, etc., may occur.

Accordingly, looking into the configuration of a laser reflow apparatus in the spotlight recently, a laser head module presses a bonding object (semiconductor chip or integrated circuit IC) for a few seconds while irradiating a laser to bond. In this way, bonding is performed by irradiating a laser in the form of a surface light source corresponding to the size of a semiconductor chip or an integrated circuit (IC).

For such a compression-type laser head module, referring to Korea Patent No. 0662820 (hereinafter referred to as 'Prior Art 1'), a configuration of a flip-chip hot-compressing module for heating the flip-chip by irradiating a laser to the rear surface of the flip-chip and pressing the flip-chip to the carrier chuck substrate is disclosed.

However, the conventional compression-type laser head module disclosed in Prior Art 1 is separated into a means for adsorbing and moving a chip to a bonding position and a means for heating the back surface of the chip through a laser and pressing the chip to the carrier chuck substrate simultaneously. Accordingly, when bonding a plurality of semiconductor chips, such as a semiconductor strip, the working time was inevitably increased because irradiating a laser while pressurizing one semiconductor chip has to be repeatedly performed as many as the number of semiconductor chips.

On the other hand, referring to Korean Patent Publication No. 2018-0137887 (hereinafter referred to as 'Prior Art 2'), the laser compression head configuration mentioned in Prior Art 2 is a state in which the pressurizing head presses several flip chips simultaneously, the laser head moves in the horizontal direction, and each flip chip is sequentially irradiated with laser one by one, or a single laser head presses several flip chips at the same time. It outlines the possibility of bonding processing by simultaneously irradiating the chip with a laser.

However, according to the conventional laser compression head configuration of the above-mentioned Prior Art 2, as a single laser beam is simultaneously irradiated to a plurality of flip chips from various angles using a single laser module, it is expected that it will be technically difficult to irradiate a homogenized laser beam and reflow the plurality of flip chips without defects.

Therefore, as a conventional single flip chip was sequentially pressed and reflowed one by one, the total working time had to be increased. Even when a single laser beam is simultaneously irradiated to a plurality of flip chips horizontally arranged on various substrate sizes for a plurality of processes, it is practically difficult to transfer sufficient thermal energy to each flip chip evenly, so there was still a problem in that it was difficult to improve the bonding defect rate.

In addition, as electronic components to be bonded on boards are getting miniaturized in recent years, the solder's size is also miniaturized. Conventionally, the fumes inevitably caused frequent and large amounts of voids during soldering.

Accordingly, voids generated in the fine solder not only cause structural or electrical fatal defects in the solder but also greatly weaken the overall operational reliability of the reflow-treated fine pattern.

DISCLOSURE OF INVENTION

Problem to be Solved by the Invention

The present invention provides a compression-type laser reflow apparatus with a vacuum chamber that enables mass processing by simultaneously pressuring and reflowing a plurality of electronic components by performing a laser reflow process by pressing with a light-transmitting pressing member and irradiating a laser beam inside the vacuum chamber, and that effectively prevents the generation of voids by fumes during soldering, so that the defect rate of the laser reflow process is greatly improved.

Means for Solving the Problem

According to some embodiments, the present invention comprises: a vacuum chamber formed of a closed space of a hexahedron, each having an inlet and outlet selectively opened and closed for drawing in and withdrawing the substrate into and out of the sealed space on one side and the other side of the hexahedron, and in which a laser beam irradiation hole is formed in an upper portion of the sealed space; a holder unit provided above the laser beam irradiation hole of the vacuum chamber so that the light-transmitting pressing member is inserted and mounted in a replaceable manner, and maintains an airtight state with the laser beam irradiation hole of the vacuum chamber not to destroy the vacuum atmosphere inside the vacuum chamber; a pressing unit that selectively presses the substrate positioned inside the vacuum chamber using the light-transmitting pressing member as the holder unit on which the light-transmitting pressing member is mounted is raised and lowered in the vertical direction; wherein pressing the plurality of electronic components arranged on the substrate by the pressing unit with a light-transmitting pressing member in a vacuum atmosphere inside the vacuum chamber, and at the same time, bonding an electronic component to a substrate by irradiating a laser beam into the vacuum chamber through the light-transmitting pressing member.

In addition, according to some embodiments, an O-ring made of an elastic material having a predetermined thickness is further equipped at a contact area between the laser beam irradiation hole of the vacuum chamber and the holder unit. And while maintaining the state in which the laser beam irradiation hole and the holder unit are in contact with the O-ring, the holder unit and the light-transmitting pressing member seated on the holder unit is vertically raised and lowered by the pressing unit.

In addition, according to some embodiments, an inlet through which the substrate is introduced is formed at one side of the vacuum chamber, and an outlet through which the substrate is drawn out is formed on the other side opposite to the inlet. And the inlet and outlet are equipped with shutters, respectively, so that the inner space of the vacuum chamber is selectively opened and closed by the shutter.

In addition, according to some embodiments, a carrier chuck is equipped in the vacuum chamber for transferring the substrate drawn in from the inlet to the laser irradiation hole directly below the laser irradiation hole, performing laser reflow, and then transferring the laser reflowed substrate to the outlet to take it out of the vacuum chamber.

In addition, according to some embodiments, two or more laser modules are equipped above the vacuum chamber, and the laser beam irradiated from the laser module is overlappingly irradiated on a plurality of electronic components arranged on a substrate through a light-transmitting pressing member.

In addition, according to some embodiments, the holder unit has a circular or left-right symmetrical regular polygonal shape with a laser beam irradiation hole formed in the center when viewed from a plan view. Arms are coupled to edge points that divide the outline into three equal parts based on the center point of the holder unit, and each pressurization unit is connected to the arms.

In addition, according to some embodiments, a reel-to-reel-type protective film transfer unit for transferring the protective film wound to one side while unwinding the roll-shaped protective film is further provided on the outside of the inlet and outlet of the vacuum chamber in order to prevent fumes generated during laser bonding from adhering to the bottom surface of the light-transmitting pressing member.

In addition, according to some embodiments, the shutter waits in a state below the inlet or outlet. When the inlet or outlet is closed, the shutter slides upward and blocks the inlet or outlet while the protective film is sandwiched in the inlet or outlet, so the inside of the vacuum chamber is closed confidentially.

In addition, according to some embodiments, the vacuum pump is driven to form a vacuum atmosphere inside the vacuum chamber after the shutter is closed.

Effect of the Invention

As described above, according to the present invention, it is possible to simultaneously press a plurality of electronic components and irradiate a homogenized laser beam, thereby greatly improving productivity by mass processing.

In addition, since the present invention is configured to be able to replace the mask plate and the light-transmitting pressing member so as to correspond to the size of the substrate or the arrangement shape of the electronic component, the defect rate is greatly reduced by uniformly reflowing all of the various substrates.

In the present invention, by performing a laser reflow process in a vacuum atmosphere inside a vacuum chamber, the generation of voids due to fumes during soldering is effectively prevented. Also, there is a remarkable effect of improving the reliability of the laser reflow process and the defect rate due to voids.

In addition, in the present invention, since the concentration of oxygen is low in the vacuum atmosphere inside the vacuum chamber, oxidation of the vacuum chamber and the metal parts and materials disposed inside the vacuum chamber is prevented, and there is an effect that the defect rate is further improved by reducing particles generated during metal oxidation.

MODE(S) FOR CARRYING OUT THE INVENTION

The terminology herein describes particular embodiments only and is not intended to be limiting. As used herein, the singular forms "a," "an," and "the" are intended to include the plural forms, including "at least one," unless the content clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined in this specification, all terms used herein (including technical and scientific terms) have the same meaning as commonly understood by those skilled in the art.

It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, the reflow apparatus of the present invention will be described in detail with reference to the accompanying FIGS. 1 to 2 as follows.

Figure 1:
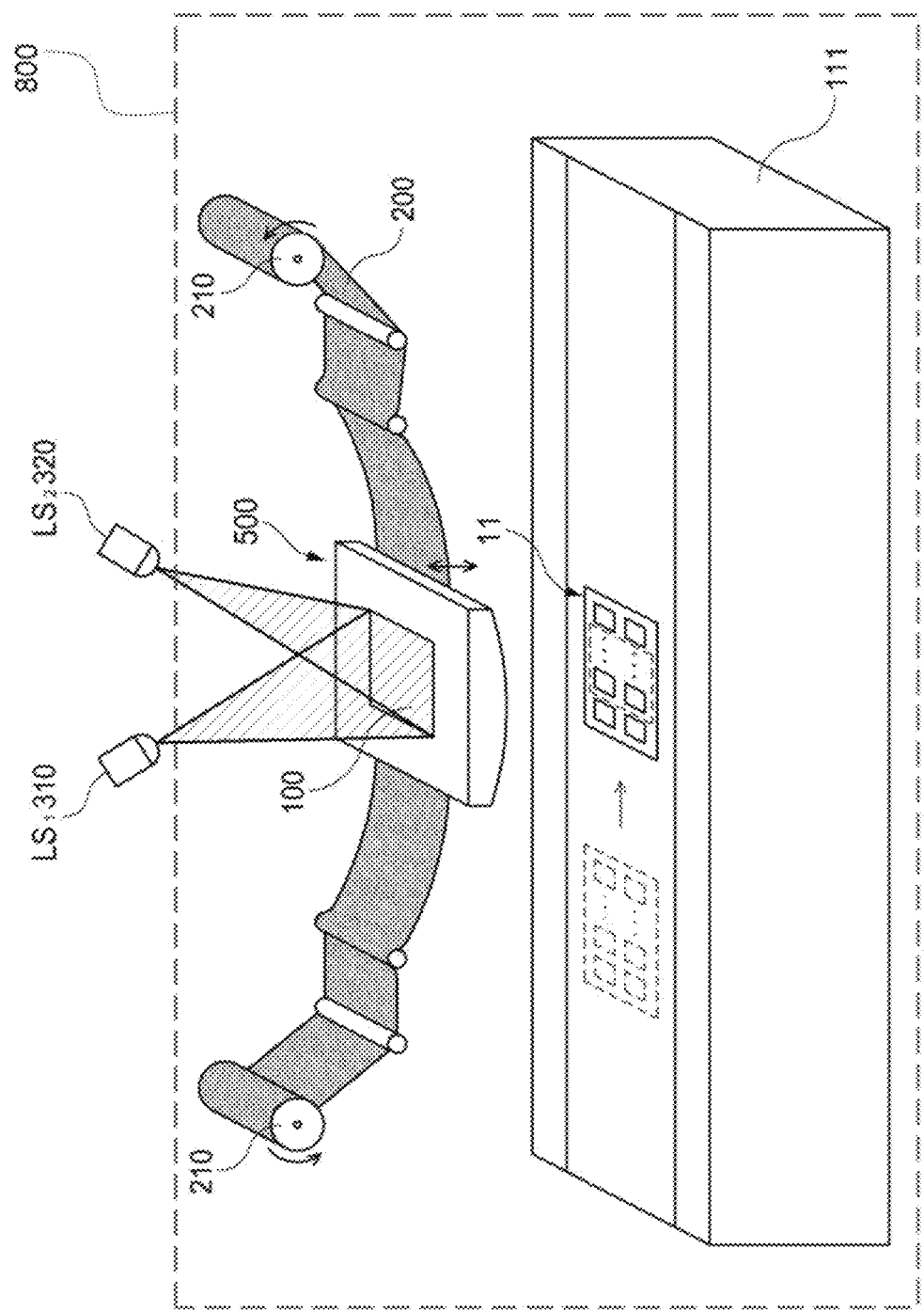
FIG. 1 is an exemplary view schematically showing the configuration of a compression-type laser reflow apparatus having a vacuum chamber of the present invention.
Figure 2:
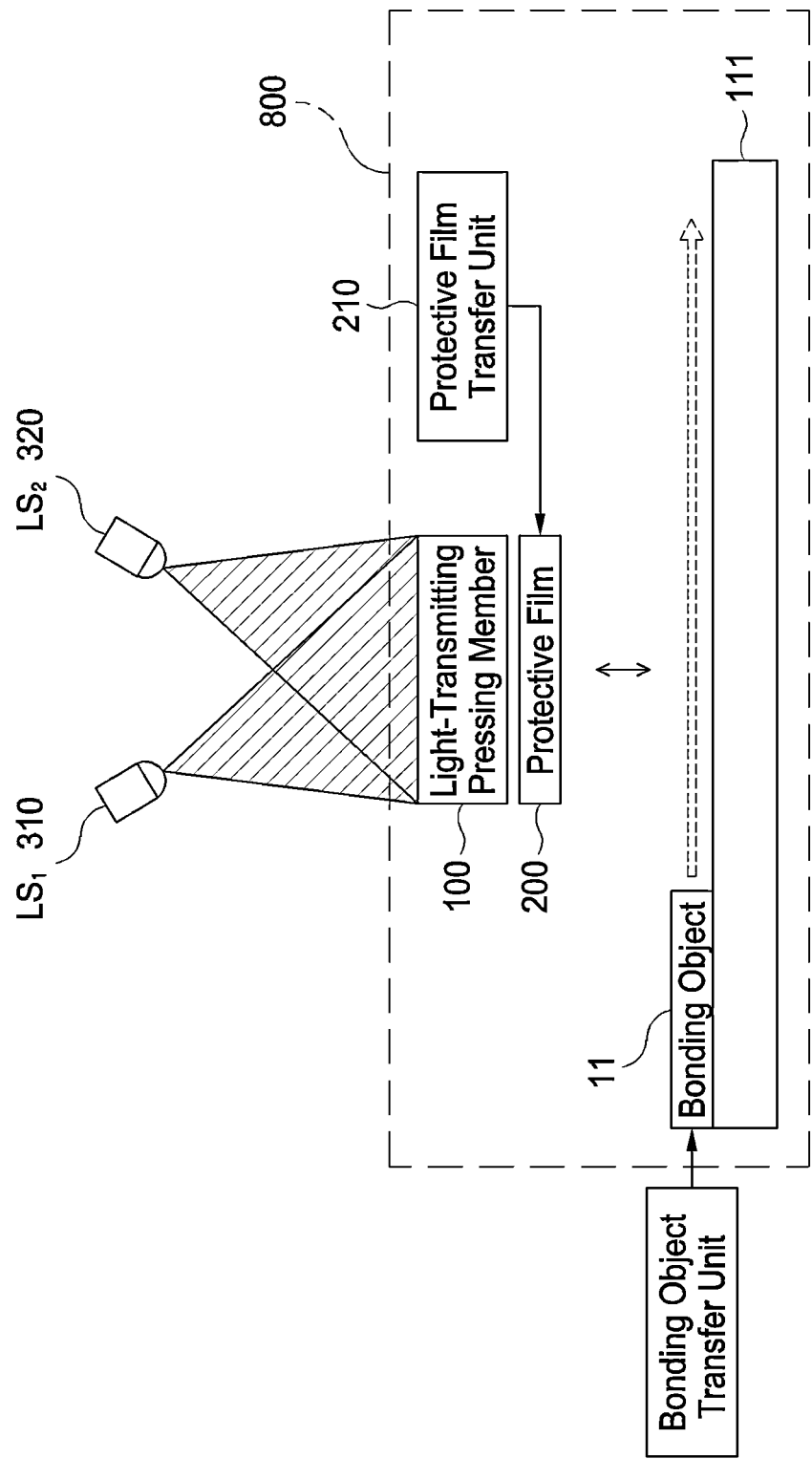
FIG. 2 is a block diagram of FIG. 1.

FIG. 1 is an exemplary view schematically showing the configuration of a compression-type laser reflow apparatus having a vacuum chamber of the present invention, and FIG. 2 is a block diagram of FIG. 1.

The laser reflow apparatus of the present invention, as shown in FIGS. 1 and 2, includes at least one multi-laser module (310, 320) for irradiating a laser in the form of a surface light source to the bonding object (11) transferred while being supported on the conveyor (111) equipped in the vacuum chamber (800), the light-transmitting pressing member (100) installed independently from the laser modules (310, 320) and transmits the laser in the form of a surface light source, and the protective film (200) for protecting the light-transmitting pressing member (100) from contamination.

First, a plurality of multi-laser modules (310, 320) irradiates a laser generated by a laser oscillator and delivered through an optical fiber to the bonding object (11) by converting the laser into a surface light source.

The multi-laser modules (310, 320) include a beam shaper (refer to FIG. 5) that converts a spot-type laser into a surface light source form and an optical unit (refer to FIGS. 5 to 9) disposed below the beam shaper and mounted with a plurality of lens modules spaced apart from each other at an appropriate distance inside the barrel so that the surface light source emitted from the beam shaper is irradiated to the irradiation area of the bonding object (11).

In addition, the multi-laser modules (310, 320) may rise or fall along the z-axis, move left or right along the x-axis, or move along the y-axis for alignment with the bonding object (11).

By forming the light-transmitting pressing member (100) for pressing the bonding object (11) and the laser modules (310, 320) for irradiating the laser in the form of a surface light source to the bonding object (11) independently of each other, the laser reflow apparatus of the present invention moves the laser modules (310, 320) to a plurality of irradiation positions of the bonding object (11) in a state in which the bonding object (11) is pressed with the light-transmitting pressing member (100) and then drives to perform one bonding operation. Accordingly, the present invention can shorten the tact time for one bonding object (11) and speed up the bonding operation for all of the plurality of bonding objects (11).

At this time, the light-transmitting pressing member (100) is moved to a working position or a standby position by a light-transmitting pressing member transfer unit (not shown) of a predetermined shape. For example, the light-transmitting pressing member transfer unit may lower or raise the light-transmitting pressing member (100) or move it left or right to lower or raise the light-transmitting pressing member (100).

In addition, although not shown in the drawings, the laser reflow apparatus, according to the present invention, may further include a control unit (not shown) for controlling the operation of the light-transmitting pressing member transfer unit (not shown) by using the data input from the pressure sensor (not shown) and the height sensor (not shown).

The pressure sensor and the height sensor may be installed on the light-transmitting pressing member (100) and the conveyor (111) supporting the light-transmitting pressing member transfer unit and the bonding object.

For example, the control unit may receive data from the pressure sensor and control the light-transmitting pressing member transfer unit so that the pressure reaches a target value, and also may receive data from the height sensor to control the light-transmitting pressing member transfer unit to reach the target value of the height.

In addition, the support unit (not shown) supports the light-transmitting pressing member transfer unit (not shown) to be movable.

For example, the support unit may be implemented as a pair of gantry extending in parallel with the conveyor (111). It should be interpreted as including a configuration supporting the light-transmitting pressing member transfer part to be movable on the x-axis, y-axis, or z-axis.

The laser reflow apparatus, according to the present invention, can be implemented by including at least one pressing unit for applying pressure to the light-transmitting pressing member (100) (refer to FIGS. 10 and 12) and at least one pressure sensor (not shown) for detecting the pressure applied to the light-transmitting pressing member (100) and at least one height sensor (not shown) for detecting the height of the light-transmitting pressing member.

In this case, the pressure sensor may be implemented as, for example, at least one load cell, and the height sensor may be implemented as a linear encoder.

By adjusting the pressure applied to the bonding object through the pressure sensor, in the case of a large area, it is possible to control so that the same pressure is transmitted to the bonding object through a plurality of actuators and a plurality of pressure sensors.

In addition, it provides technical data that can confirm the height position value when the bonding object is bonded or find a more accurate bonding height value through one or more or multiple height sensors. It controls the exact height when performing a process that needs to maintain an interval of a certain height.

In addition, the light-transmitting pressing member (100) may be implemented as a base material that transmits the laser output from the laser modules (310, 320). The base material of the light-transmitting pressing member (100) can be implemented with any beam-transmitting material.

The base material of the light-transmitting pressing member (100) may be implemented with, for example, any one of quartz, sapphire, fused silica glass, or diamond.

However, the physical properties of the light-transmitting pressing member made of quartz differ from that of the light-transmitting pressing member made of sapphire.

For example, when irradiating a 980 nm laser, the transmittance of the light-transmitting pressing member made of quartz material is 85% to 99%, and the temperature measured at the bonding object is 100° C. On the other hand, the transmittance of the light-transmitting pressing member made of sapphire is 80% to 90%, and the temperature measured at the bonding object is 60° C.

Quartz exhibits superior performance than sapphire in terms of light transmittance and heat loss required for bonding.

However, the inventor of the present application repeatedly tested the light-transmitting pressing member (100) while developing the laser reflow apparatus. As a result, the light-transmitting pressing member (100) made of a quartz material has cracks during laser bonding, or the bonding quality was poor due to the occurrence or burning on the bottom surface.

It was analyzed that the gas (fume) generated during laser bonding adheres to the bottom surface of the light-transmitting pressing member (100), and the heat source of the laser is concentrated on the part to which the gas (fume) is adhered, thereby increasing thermal stress.

To prevent damage to the light-transmitting pressing member (100) made of a quartz material and to improve durability, a thin film coating layer may be formed on the bottom surface of the light-transmitting pressing member made of a quartz material.

The thin film coating layer formed on the bottom surface of the light-transmitting pressing member (100) may be implemented as a conventional optical coating, such as dielectric coating, SiC coating, or metallic material coating.

The laser reflow apparatus, according to the present invention, as shown in FIG. 1, further includes a protective film (200) that prevents gas (fume) generated during laser bonding from sticking to the bottom surface of the light-transmitting pressing member (100) and a protective film transfer unit (210) that transfers the protective film (200), under the light-transmitting pressing member (100).

According to some embodiments, the protective film transfer unit (210) may be implemented in a reel-to-reel method in which the protective film (200) wound in the form of a roll is released and transferred to one side.

The protective film (200) is preferably implemented with a material having excellent heat resistance, for example, a maximum use temperature of 300° C. or more and a continuous maximum use temperature of 260° C. or more.

For example, the protective film (200) may be implemented with a polytetrafluoroethylene resin (commonly referred to as a Teflon resin; Polytetrafluoroethylene, PTFE) or a perfluoro alkoxy resin.

As perfluoro alkoxy resin (Per Fluoro Alkylvinyether copolymer; PFA) is a product that improves the heat resistance of fluorinated ethylene propylene resin, it is a highly functional resin with the highest continuous use temperature recorded at 260° C., the same as that of polytetrafluoroethylene resin.

Figure 3:
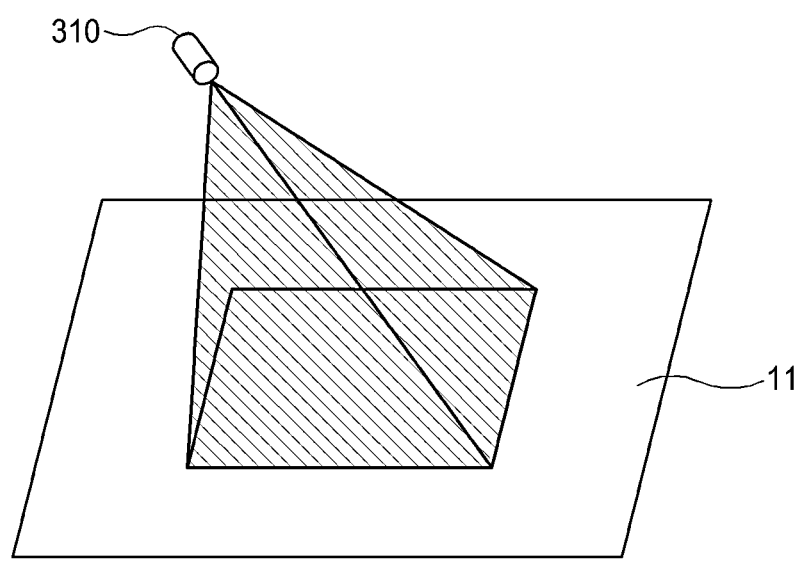
FIG. 3 is a conceptual diagram of a single laser module according to some embodiments of the present invention.
Figure 4:
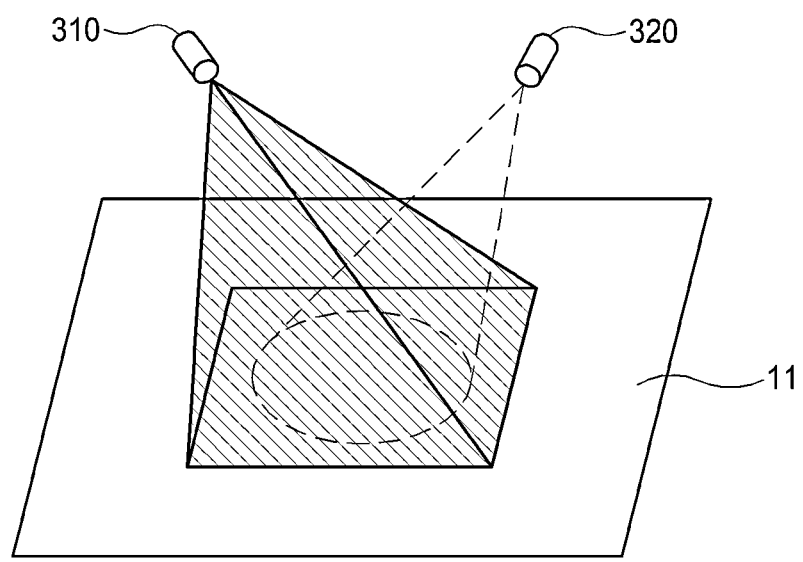
FIG. 4 is a conceptual diagram of a multi-laser module according to some embodiments of the present invention.

FIG. 3 is a conceptual diagram of a single laser module according to some embodiments of the present invention, and FIG. 4 is a conceptual diagram of a multi-laser module according to some embodiments of the present invention.

Referring to FIG. 3, the present invention includes a single laser module (310) according to some embodiments and thus irradiates a single laser beam onto the FPCB substrate. At this time, the laser beam irradiated by the first laser module (310) is irradiated on the substrate in a state in which the intensity of the laser beam is transformed into a homogenized square beam shape.

Meanwhile, referring to FIG. 4, according to some embodiments of the present invention, the multi-laser module includes, for example, a first laser module (310) and a second laser module (320). At a position where the electronic component of the bonding object (11) is attached, the first and second laser modules are irradiated in an overlapping state so that the homogenized overlapping laser beam is irradiated.

Although the first laser beam is shown as having a square shape and the second laser beam has a circular shape in FIG. 4, both laser beams may have a square shape. In addition, the first laser beam and the second laser beam may be simultaneously irradiated, or the second laser beam may be sequentially irradiated after preheating the bonding object (11) by the first laser beam.

Figure 5:
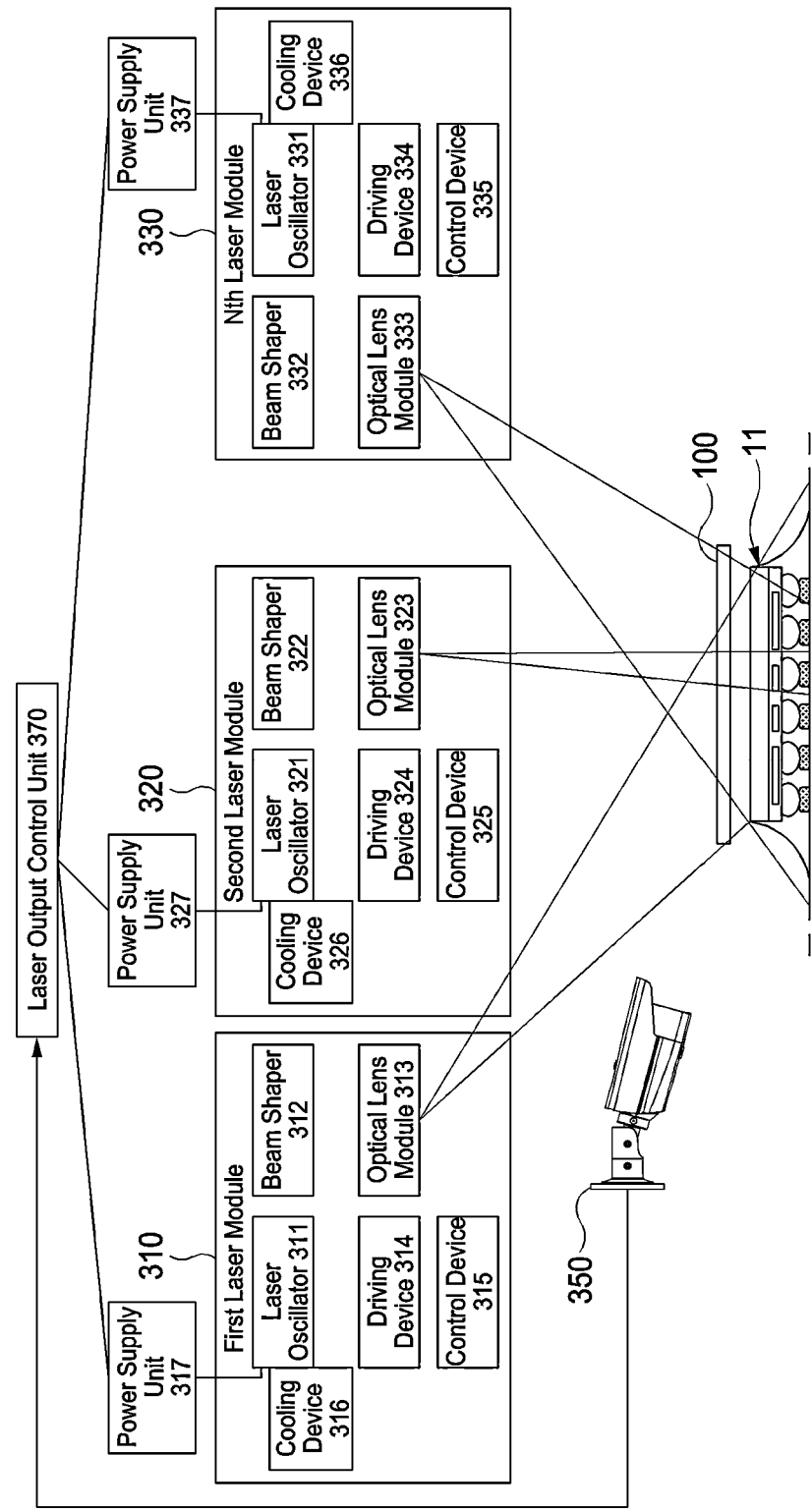
FIG. 5 is a block diagram of a multi-laser module according to some embodiments of the present invention.

FIG. 5 is a block diagram of a multi-laser module according to some embodiments of the present invention.

In FIG. 5, each laser module (310, 320, . . . 330) includes a laser oscillator (311, 321, 331) having a cooling device (316, 326, 336), a beam shaper (312, 322, 332), an optical lens module (313, 323, 333), a driving device (314, 324, 334), a control device (315, 325, 335) and a power supply unit (317, 327, 337), respectively.

Hereinafter, except where necessary, the first laser module (310) among laser modules having the same configuration will be mainly described to avoid overlapping descriptions.

The laser oscillator (311) generates a laser beam having a wavelength and output power in a predetermined range. The laser oscillator may be, for example, a diode laser (Laser Diode, LD) having a wavelength of '750 nm to 1200 nm' or '1400 nm to 1600 nm' or '1800 nm to 2200 nm' or '2500 nm to 3200 nm' or a Rare-Earth-Doped Fiber Laser or a Rare-Earth-Doped Crystal Laser. Alternatively, it may include a medium for emitting alexandrite laser light with a wavelength of 755 nm or a medium for emitting Nd:YAG laser light with a wavelength of 1064 nm or 1320 nm.

The beam shaper (312) converts a spot-type laser generated from a laser oscillator and transmitted through an optical fiber into an area beam type having a flat top. The beam shaper (312) may be implemented by including a square light pipe, a diffractive optical element (DOE), or a micro-lens array (MLA).

The optical lens module 313 adjusts the shape and size of the laser beam converted from the beam shaper to the surface light source to irradiate the electronic component mounted on the PCB board or the irradiation area. The optical lens module constitutes an optical system by combining a plurality of lenses. The configuration of such an optical system will be described later in detail with reference to FIGS. 6 to 9.

The driving device (314) moves the distance and position of the laser module for the irradiation surface. The control device (315) controls the driving device (314) to adjust the beam shape, the beam area size, the beam sharpness, and the beam irradiation angle when the laser beam reaches the irradiation surface. The control device (315) may also integrally control the operation of each unit of the laser module (310) in addition to the driving device (314).

Meanwhile, the laser output control unit (370) controls the amount of power supplied to each laser module from the power supply units (317, 327, 337) corresponding to each laser module (310, 320, 330) depending on the program received through the user interface or a preset program. The laser output control unit (370) receives information about each component, each area, or the entire reflow state on the irradiation surface from one or more camera modules (350) and controls each power supply unit (317, 327, 337) based on the received information.

On the other hand, the control information from the laser output control unit (370) is transmitted to the control devices (315, 325, 335) of each of the laser modules (310, 320, 330). It is also possible to provide a feedback signal for controlling the respective power supply unit (317) corresponding to each control device (315, 325, 335). In addition, unlike FIG. 6, it is possible to distribute power to each laser module through a single power supply unit. In this case, the laser output control unit (370) must control the power supply unit.

When implementing the laser overlap mode, the laser output control unit (370) controls each laser module and power supply units (317, 327, 337) so that the laser beam from each laser module (310, 320, 330) has the required beam shape, beam area size, beam sharpness, and beam irradiation angle.

In addition to the case of preheating the area around the debonding target position using the first laser module (310) and further heating the narrower reflow target area using the second laser module (320), the laser overlap mode is also applied when controlling each laser module to have a required temperature profile by properly distributing the preheating function or the additional heating function between the first, second, and third laser modules (310, 320, . . . 330).

Meanwhile, when one laser light source is distributed and input to each laser module, a function for simultaneously adjusting the output and the phase of each distributed laser beam may be provided in the laser output control unit (370). In this case, by controlling the phase to induce destructive interference between the respective laser beams, the beam flatness can be remarkably improved, and energy efficiency is further increased accordingly.

On the other hand, in the case of implementing the multi-position simultaneous processing mode, the laser output control unit (370) controls at least one of a beam shape, a beam area size, beam sharpness, a beam irradiation angle, and a beam wavelength of each laser beam so that some or all of the laser beams from each laser module are different. Even at this time, when one laser light source is distributed and input to each laser module, a function for simultaneously adjusting the output and the phase of each distributed laser beam may be provided in the laser output control unit (370).

Through this function, bonding between the electronic components and the substrate in the irradiation surface can be performed, or bonding can be removed by adjusting the laser beam size and output. In particular, in the case of removing damaged electronic components from the substrate, as the area of the laser beam is minimized to the area of the corresponding electronic component, it is possible to minimize the application of heat by the laser beam to other adjacent electronic components or normal electronic components existing on the substrate. Accordingly, it is possible to remove only the damaged electronic component to be removed.

On the other hand, when a plurality of laser modules emit laser beams having different wavelengths, the laser module may be composed of an individual laser module having a wavelength each well absorbed by a plurality of material layers (e.g., an EMC layer, a silicon layer, a solder layer) included in the electronic component. Accordingly, the laser debonding apparatus, according to the present invention, may selectively and differently increase the temperature of the electronic component and the temperature of intermediate bonding materials such as solder, which is a connecting material between electrodes of printed circuit boards or electronic components to perform an optimized bonding (attaching or bonding) or detaching (detaching or debonding) process.

Specifically, it penetrates both the EMC mold layer and the silicon layer of the electronic component so that the solder layer absorbs all energy of each laser beam. Or, the laser beam may heat the surface of the electronic component without passing through the EMC mold layer so that heat is conducted to the bonding unit under the electronic component.

Meanwhile, by utilizing the above functions, a predetermined substrate region which includes the electronic component region to be reflowed and its periphery is preheated to a predetermined preheating temperature by at least one first laser beam. And then, the temperature of the electronic component region to be reflowed is selectively heated to a reflow temperature at which solder melting occurs by the at least one second laser beam.

FIGS. 6 to 9 are diagrams of a laser optical system applicable to a single or a multi-laser module of the laser compression head module of the present invention.

Figure 6:
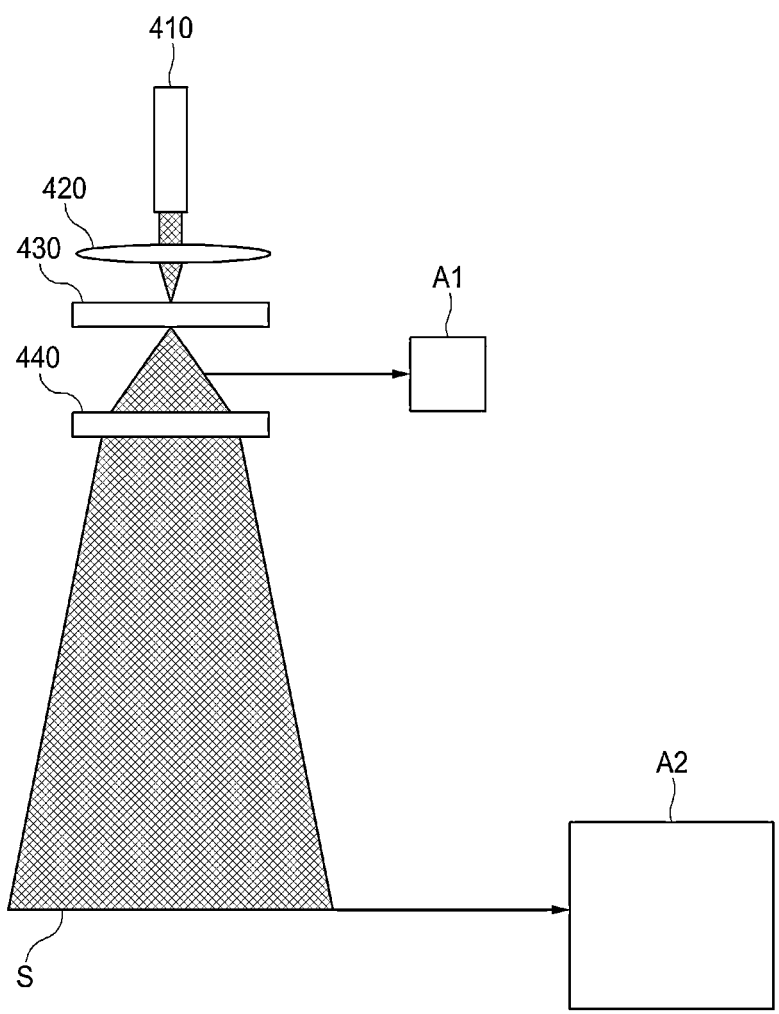
FIGS. 6 to 9 are diagrams of a laser optical system applicable to a multi-laser module according to some embodiments of the present invention.

FIG. 6 is an optical system of the simplest structure applicable to the present invention. When the laser beam emitted from the beam transmission optical fiber (410) is focused through the convex lens (420) and is incident on the beam shaper (430), the laser beam in the form of a spot is converted into a flat-top type of surface light source (A1) in the beam shaper (430). The square laser beam (A1) output from the beam shaper (430) is expanded to the desired size through the concave lens (440) and is irradiated to the imaging plane (S) with the expanded surface light source (A2).

Figure 7:
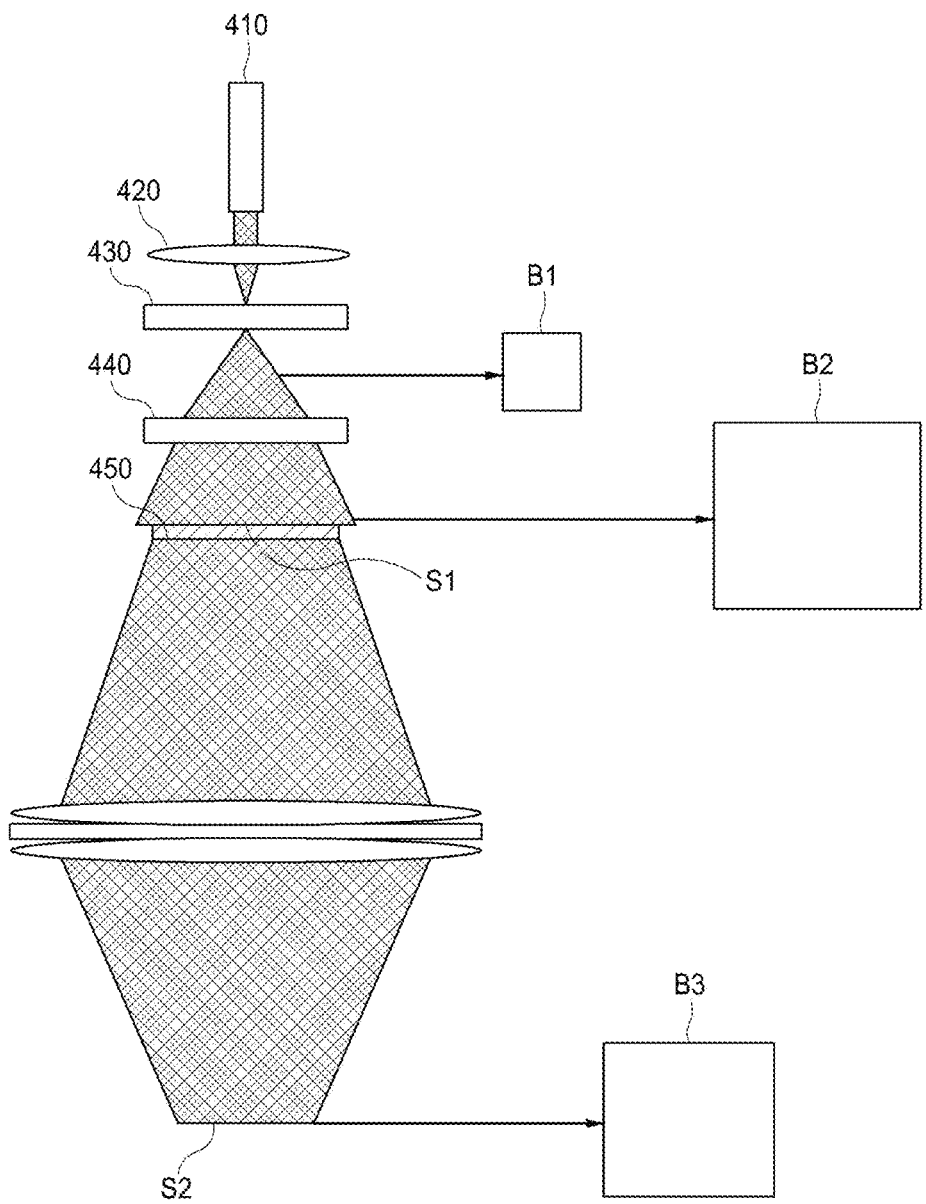

FIG. 7 is a diagram of a laser optical system according to some embodiments of the present invention.

The surface light source (B1) from the beam shaper (430) is enlarged to a predetermined size through the concave lens (440) to become the surface light source (B2) irradiated to the first imaging surface (S1). If the surface light source B2 is to be further enlarged and used, the boundary of the edge portion of the surface light source (B2) may become more unclear according to the additional enlargement. Therefore, to obtain the irradiated light with a clear edge even on the final irradiation surface of the second imaging surface (S2), the mask (450) is installed on the first imaging surface (S1) to trim the edges.

The surface light source passing through the mask (450) is reduced (or enlarged) to the desired size while passing through the zoom lens module (460) composed of a combination of one or more convex and concave lenses. And then, a rectangular irradiation light (B3) is formed on the second imaging surface (S2) on which the electronic component is disposed.

Figure 8:
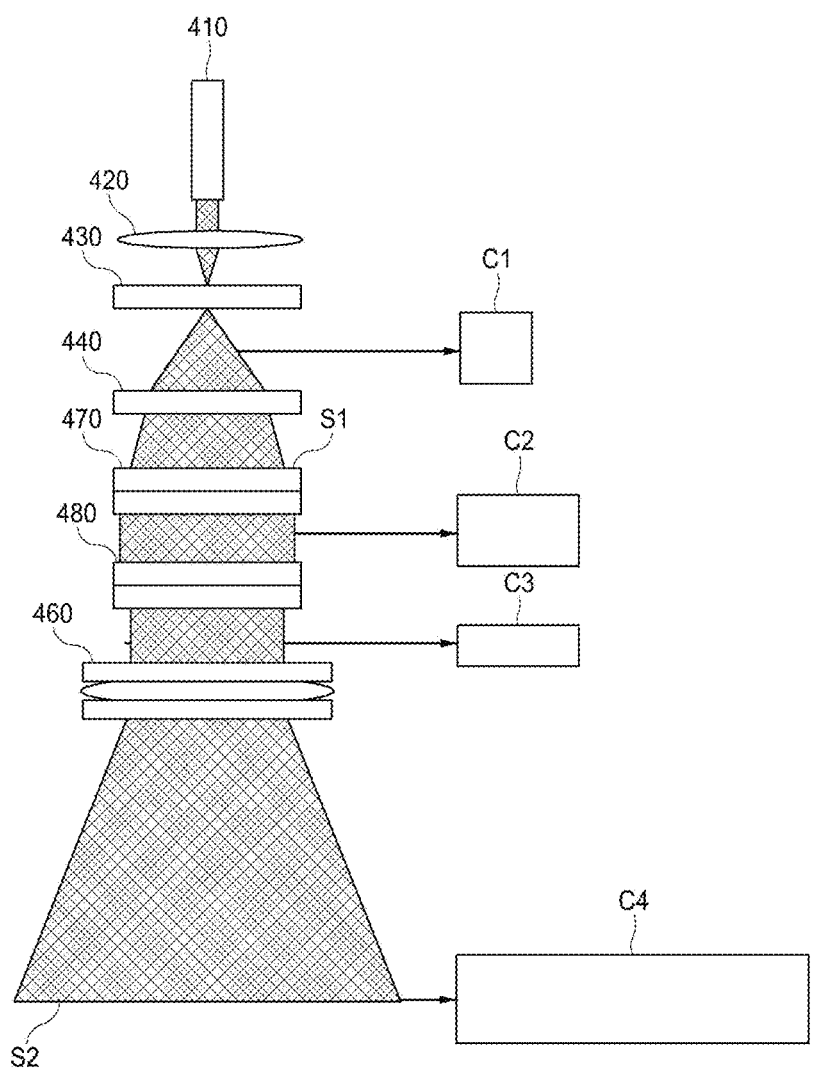

FIG. 8 is a diagram of a laser optical system according to some embodiments of the present invention.

After the square surface light source (C1) from the beam shaper (430) is enlarged to a predetermined size through the concave lens (440), it passes through at least a pair of cylindrical lenses (470), for example, is enlarged (or reduced)(C2) in the x-axis direction. Again as it passes through at least one pair of cylindrical lenses (480), it is reduced (or enlarged), for example, in the y-axis direction and converted into a rectangular-shaped surface light source (C3).

Here, the cylindrical lens is a shape in which the cylindrical shape is cut in the longitudinal direction and functions to expand or reduce the laser beam according to the shape in which each lens is disposed of in the vertical direction. And the cylindrical lens adjusts the laser beam in the x-axis or y-axis direction according to the shape in which the lens is disposed of in the x and y-axis directions on the surface on which the cylindrical lens is disposed.

Then, the surface light source (C3) is enlarged (or reduced) to a desired size while passing through the zoom lens module (460) composed of a combination of one or more convex and concave lenses, and forms a rectangular irradiation light (C4) on the second imaging surface (S2) on which the electronic component is disposed.

Figure 9:
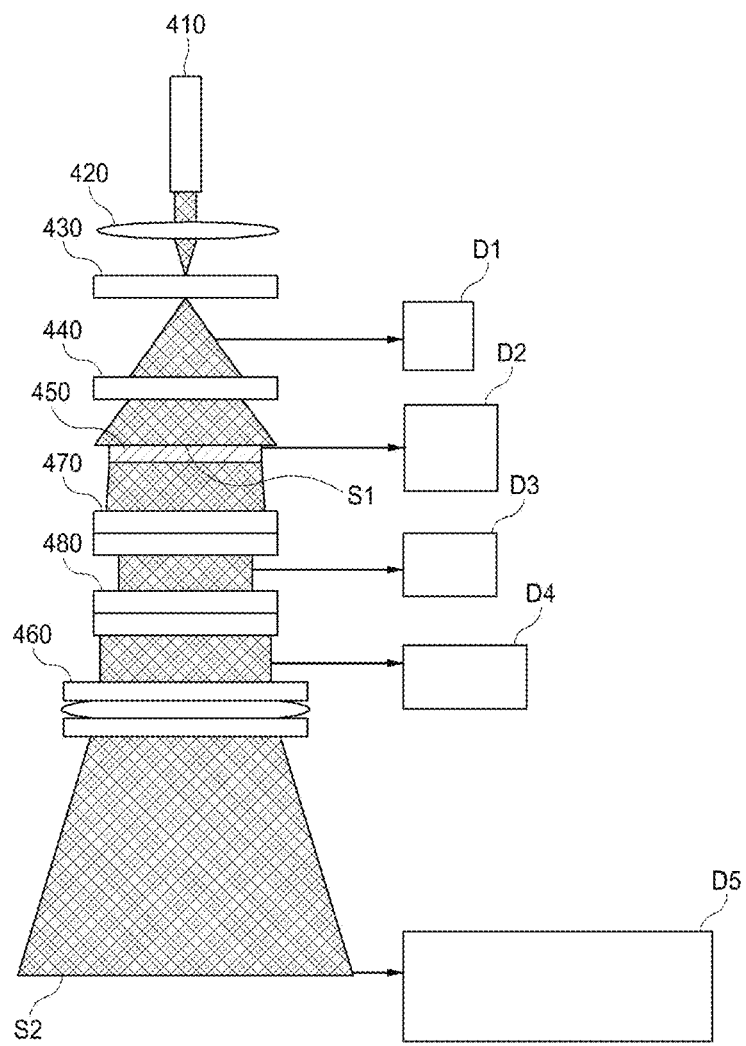

FIG. 9 is a diagram of a laser optical system according to some embodiments of the present invention.

The optical system of FIG. 9 is an addition of a configuration for trimming the edge of the laser beam by applying a mask to the optical system of FIG. 8, and it is understood that the final surface light source (D5) having sharper edges can be obtained compared to the case of FIG. 8.

Figure 10:
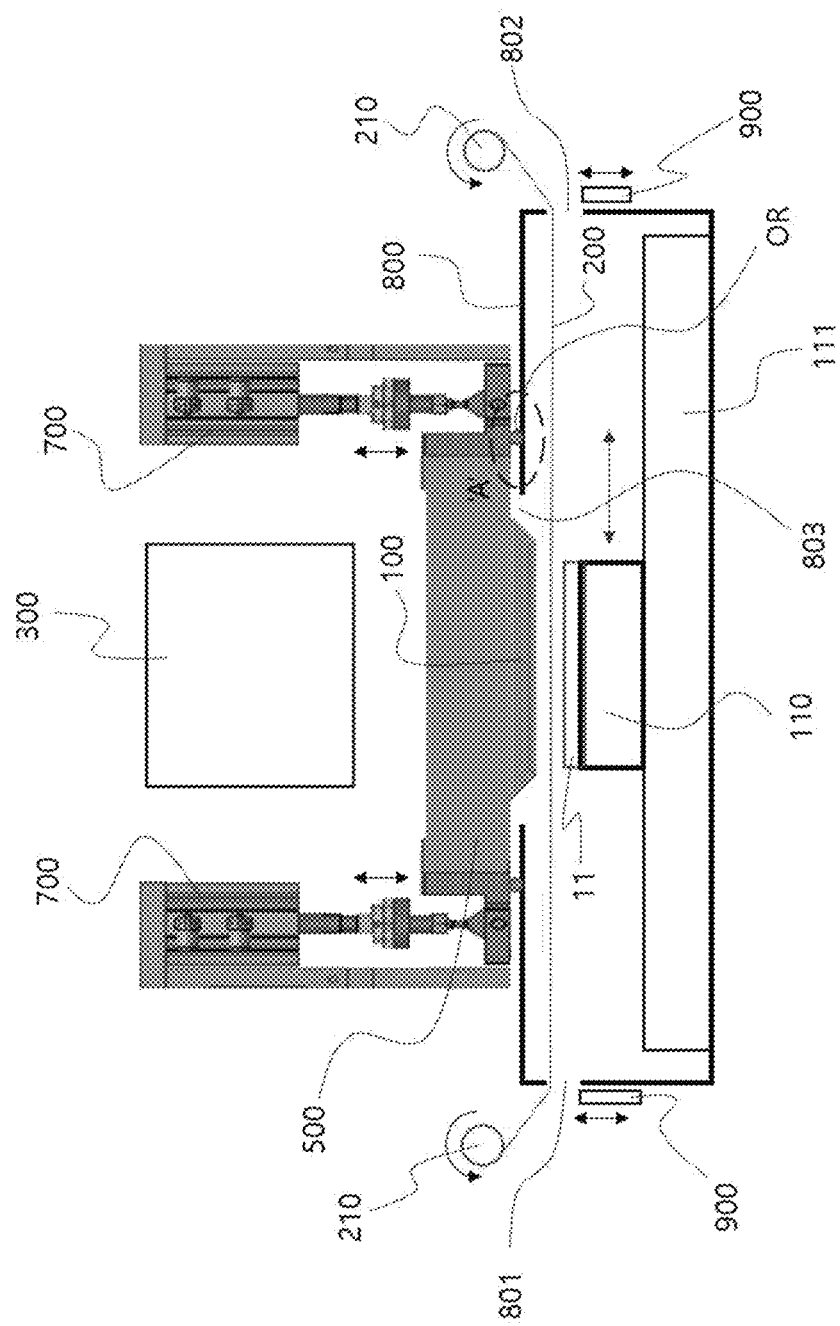
FIG. 10 is a longitudinal cross-sectional view showing the main part of the configuration of a compression-type laser reflow apparatus having a vacuum chamber according to some embodiments of the present invention.
Figure 11:
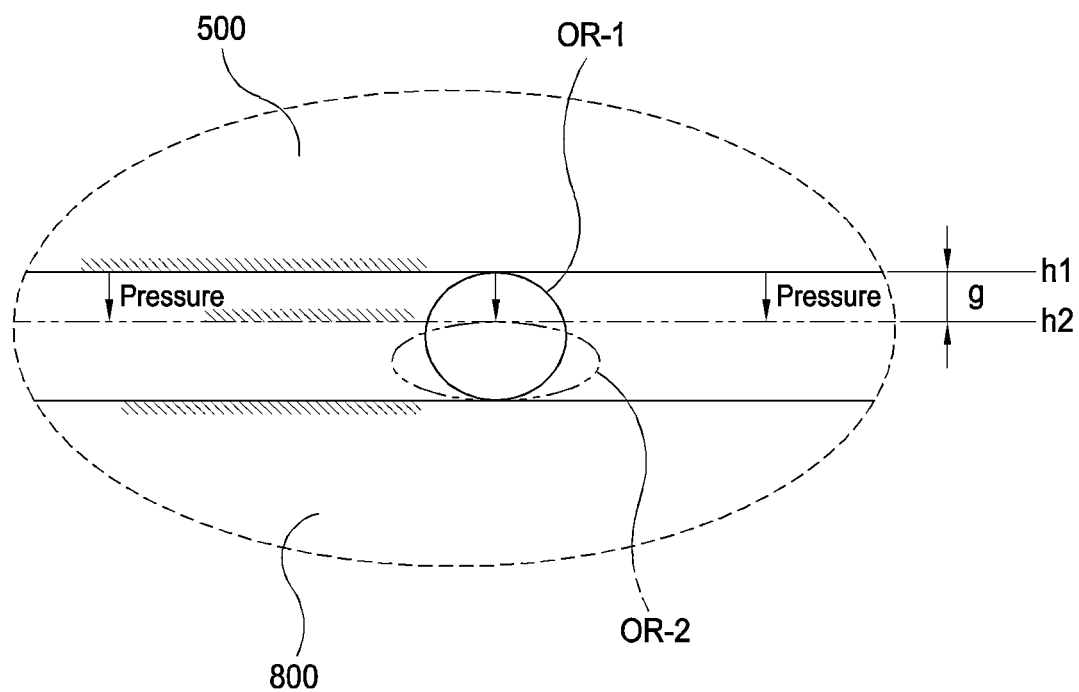
FIG. 11 is an enlarged view of the main part of the 'A' part of FIG. 10.
Figure 12:
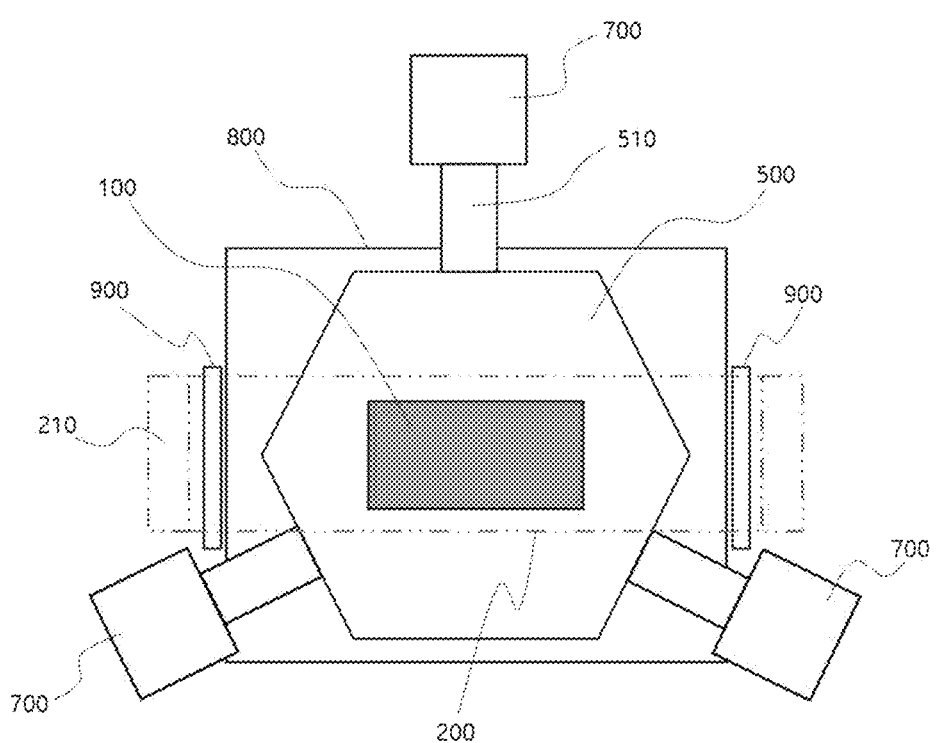
FIG. 12 is a plan view of the main part of FIG. 10.

FIG. 10 is a longitudinal cross-sectional view showing the main part of the configuration of a compression-type laser reflow apparatus having a vacuum chamber according to some embodiments of the present invention; FIG. 11 is an enlarged view of the main part of 'A' of FIG. 10; and FIG. 12 is a plan view of the main part of FIG. 10.

Hereinafter, with reference to FIGS. 10 to 12, the configuration of the compression-type laser reflow apparatus having the vacuum chamber of the present invention will be described in more detail as follows.

First, referring to FIG. 10, the laser reflow apparatus of the present invention includes a vacuum chamber (800) formed as a sealed space unit of a hexahedron.

On one side and the other side of the vacuum chamber (800), an inlet (801) and an outlet (802) that are selectively opened and closed to draw in and take out the substrate, which is the bonding object (11), into the sealed space of the vacuum chamber are respectively formed. And a laser beam irradiation hole (803) is formed in the center of the upper surface of the vacuum chamber (800).

In addition, a holder unit (500) is provided above the laser beam irradiation hole (803) of the vacuum chamber (800), and a light-transmitting pressing member (100) is installed in the holder unit (500) so that it can be replaced. At this time, the light-transmitting pressing member (100) seated in the holder unit is in a state in which the bottom (pressurizing surface) to be in contact with the bonding object is positioned inside the vacuum chamber through the laser irradiation hole for pressing the bonding object. (Refer to FIG. 10.)

Accordingly, the laser beam irradiated from the laser module (300) provided above the vacuum chamber (800) is irradiated into the vacuum chamber (800) through the light-transmitting pressing member (100) mounted on the holder unit (500), and the laser irradiation hole (803) of the vacuum chamber (800).

In addition, at least one pressurization unit (700) is provided along the edge of the holder unit (500).

The pressurization unit (700) is a component that provides power to vertically elevate and lower the holder unit 500 on which the light-transmitting pressing member (100) is seated, as described above. As the light-transmitting pressing member (100) selectively presses down the edge of the holder unit (500) on which it is seated, the substrate (11) positioned inside the vacuum chamber (800) is pressed by the light-transmitting pressing member.

That is, the plurality of electronic components arranged on the substrate (11) by the pressurization unit (700) is pressed by the light-transmitting pressing member (100) in a vacuum atmosphere inside the vacuum chamber (800). At the same time, the laser beam irradiated from the laser modules (310, 320) is irradiated into the vacuum chamber (800) through the light-transmitting pressing member (100).

A mode in which the light-transmitting pressing member (800) presses the substrate may be configured in various modes, for example, the self-weight pressing mode in which the light-transmitting pressing member (100) is first contacted with the electronic component on the substrate (11) and then pressurized by loading its weight and the force pressing mode in which the pressurization unit (700) further descends and presses during the laser beam irradiated to the electronic component on the substrate. According to the present invention, one or more of the above pressurization modes may be mixed in the actual laser reflow process.

In particular, the holder unit (500) is vertically raised and lowered by the pressurization unit (700) in a state in which the light-transmitting pressing member (100) is seated in the center. At this time, the holder unit (500) must maintain an airtight state with the laser beam irradiation hole (803) of the vacuum chamber (800) so as not to destroy the vacuum atmosphere inside the vacuum chamber (800).

For this, an O-ring (OR) made of an elastic material having a predetermined thickness or more is provided at a contact area between the laser beam irradiation hole (803) of the vacuum chamber (800) and the holder unit (500). Since the periphery of the laser beam irradiation hole (803) of the vacuum chamber (800) and the holder unit (500) are in contact with each other by an O-ring (OR) provided therebetween, they always maintain a state of airtight contact with each other.

In addition, an inlet (801) through which the substrate is introduced is formed at one side of the vacuum chamber (800), and an outlet (802) is formed at the other side opposite to the inlet (801).

In addition, the inlet (801) and the outlet (802) are provided with a shutter (900), respectively, so that the inlet (801) and the outlet (802) of the vacuum chamber (800) are selectively opened and closed by the shutter (900).

According to some embodiments, the shutter (900) is adjacent to the inlet (801) and the outlet (802) and is positioned below the inlet (801) and the outlet (802) to stand by. Then, when the inlet (801) or outlet (802) is to be closed, the shutter (900) slides upward and closes the inlet (801) or the outlet (802) airtightly while the protective film (200) is sandwiched in the inlet (801) or the outlet (802). (Refer to FIG. 10.)

In addition, after the shutter (900) is closed, a vacuum pump (not shown) is driven to form a vacuum atmosphere in the vacuum chamber (800).

In addition, in the vacuum chamber (800), the substrate (11) introduced through the inlet (801) is transferred directly below the light-transmitting pressing member (100) for laser reflow processing. After that, a carrier chuck (110) and a conveyor (111) are provided for transferring the laser reflow-treated substrate (11) to the outlet (802) to take it out of the vacuum chamber (800).

In addition, the laser module (300) is provided above the vacuum chamber (800), and the laser beam irradiated from the laser module (300) is overlappingly irradiated on the plurality of electronic components arranged on the substrate (11) through the light-transmitting pressing member (100).

As described above, the laser module (300) may be a single or multi-laser module in which two or more laser modules are combined. If necessary, two laser modules, that is, the first laser module (310) and the second laser module (320), may be provided to overlap the laser beam as previously shown in FIGS. 1, 2, 4, and 5.

In addition, when viewed from a plane, the holder unit (500) has a circular or left-right symmetrical regular polygonal shape along with a laser beam irradiation hole (803) formed in the center. And the pressurization unit (700) is connected to points at which the outer line is equally divided into three based on the center point of the holder unit (500).

More specifically, referring to FIG. 12, according to some embodiments, the planar shape of the holder unit (500) may be a regular hexagonal shape, and the light-transmitting pressing member (100) is replaceably seated in the center of the holder unit (500). In addition, the arms (510) are respectively connected to three edges of the holder unit (500) divided by 120 degrees from the center in the plan view. A pressurization unit (700) is installed at an end opposite to the holder unit (500) of the arm (510) so that the three arms (510) are raised and lowered, respectively.

In addition, on the outside of the inlet (801) and outlet (802) of the vacuum chamber (800), a reel-to-reel type protective film transfer unit (210) for transferring the protective film (200) wound in a roll shape to one side while unwinding is further provided, respectively.

Here, the protective film (200) prevents fumes generated during laser bonding from directly adhering to the bottom surface of the light-transmitting pressing member (100).

Therefore, when the protective film (200) under the light-transmitting pressing member (100) is contaminated by fumes as the laser reflow process is performed several times, a new protective film (200) that is not contaminated by fume while the protective film (200) unwound from the protective film transfer unit (unwinder, 210) outside the inlet (801) is wound on the protective film transfer unit (winder, 210) outside the outlet (802) through the space between the light-transmitting pressing member (100) and the substrate (11) inside the vacuum chamber (800) through the inlet (801), is shifted to be located below the light-transmitting pressing member (100).

Hereinafter, an operation relationship of the laser reflow apparatus of the present invention having the above-described configuration will be described.

First, as the shutter (900) on the inlet (801) side of the vacuum chamber (800) is opened, the substrate (11), which is the bonding object, is introduced into the vacuum chamber (800) through the inlet (801) and is then loaded onto the carrier chuck (110). The carrier chuck (110) transfers the substrate directly below the light-transmitting pressing member (100) by the conveyor (111) in a state in which the substrate (11) is loaded.

Subsequently, although not shown in the drawing after the shutter (900) on the inlet (801) side is closed, as the vacuum pump (not shown) connected to one side of the vacuum chamber (800) is driven to discharge the air inside the vacuum chamber (800) to the outside of the vacuum chamber (800), a vacuum atmosphere is created inside the vacuum chamber (800).

Subsequently, when the inside of the vacuum chamber (800) reaches a predetermined negative pressure, the compression-type laser reflow process of the present invention performs. First, as the pressurization unit (700) lowers the holder unit (500), the light-transmitting pressing member (100) seated on the holder unit (500) also descends into the vacuum chamber (800).

At this time, when the holder unit (500) is lowered, the O-ring (OR) provided between the vacuum chamber (800) and the holder unit (500) is pressed. The O-ring (OR) is compressed by the holder unit (500) as much as the holder unit (500) descends. (Refer to FIG. 11.)

Accordingly, the O-ring (OR) is compressed by the distance (g) that the holder unit (500) and the light-transmitting pressing member (100) descend. The light-transmitting pressing member (100), which descends together with the holder unit (500) in a state of being seated on the holder unit (500), is in contact with the electronic component on the substrate (11), which is a bonding object transferred for laser reflow in the vacuum chamber (800).

That is, referring to FIG. 11, after being compressed at the height (h1) of the O-ring (OR-1) before being compressed by the holder unit (500), the holder unit (500) descends by the compressed gap (g) of the O-ring (OR) by subtracting the height (h2) of the O-ring (OR-2).

Then, while the light-transmitting pressing member (100) descends, the electronic components disposed on the substrate (11) are pressed with a predetermined pressure. At the same time, the solder (not shown) is heated while the laser beam irradiated from the laser module (300) is irradiated to the electronic component on the substrate (11) through the light-transmitting pressing member (100), and the laser beam irradiation hole (803) of the vacuum chamber (800).

Accordingly, as the electronic components on the substrate (11), which are the bonding objects, are pressed by the light-transmitting pressing member (100) and simultaneously heated by the laser beam, the solder (not shown) disposed under the electronic components is melted and the electronic component is bonded to the substrate (11). Thus, the laser reflow process of the present invention is completed.

In addition, as described above, when the overlapping laser beam is irradiated to the peripheral substrate portion other than the electronic component, the peripheral substrate portion may be damaged by the thermal energy of the laser beam, so it is necessary to limit the irradiation to the electronic component of the bonding object (11).

To accurately pressurize and laser reflow only the electronic components of the bonding object (11), it is preferable to design the area of the laser irradiation hole (803) and the light-transmitting pressing member (100) in consideration of the transmission path and overlapping area of the laser beam.

In addition, in the present invention, it is preferable to configure the light-transmitting pressing member (100) of the holder unit (500) to be replaceable so as to correspond to the size of the various substrates (11).

Therefore, the substrate (11) of a different size can be configured to proceed, or the holder unit (500) and the light-transmitting pressing member (100) may be configured to be replaceable with different ones according to the shape and area of the electronic component disposed on the substrate (11).

In addition, although not shown in the drawings, in the present invention, after replacing the light-transmitting pressing member (100), the flatness of the replaced light-transmitting pressing member (100) can be measured by probing the upper surface of the light-transmitting pressing member (100) through a separate probe unit (not shown).

Therefore, after an operator replaces the light-transmitting pressing member (100) with a different size to process the substrate (11) of a different size, the flatness of the light-transmitting pressing member (100) is measured using the probe unit (not shown). In addition, adjusting the flatness of the light-transmitting pressing member (100) described above can be automated by setting the control unit.

In addition, the present invention is not limited only by the above-described embodiments, and the same effect can be created even when the apparatus's detailed configuration, number, and layout structure are changed. Accordingly, it is intended to state that those of ordinary skill in the art can add, delete, and modify various configurations within the scope of the technical features of the present invention.

DESCRIPTION OF THE NUMERALS

100: light-transmitting pressing member
200: protective film
210: protective film transfer unit
300: laser module
500: holder unit
700: pressurization unit
800: vacuum chamber
801, 802: (substrate) inlet, outlet
803: laser beam irradiation hole
900: shutter
OR: O-ring
OR-1: (before being compressed) O-ring
OR-2: (after being compressed) O-ring
G: Compression displacement value (gap)

The invention claimed is:

1. A compression-type laser reflow apparatus with a vacuum chamber comprising:
a vacuum chamber formed of a closed space of a hexahedron, each having an inlet and outlet selectively opened and closed for drawing in and withdrawing the substrate into and out of the sealed space on one side and the other side of the hexahedron, and in which a laser beam irradiation hole is formed in an upper portion of the sealed space;
a holder unit provided above the laser beam irradiation hole of the vacuum chamber so that the light-transmitting pressing member is inserted and mounted in a replaceable manner, and maintains an airtight state with the laser beam irradiation hole of the vacuum chamber not to destroy the vacuum atmosphere inside the vacuum chamber;
a pressing unit that selectively presses the substrate positioned inside the vacuum chamber using the light-transmitting pressing member as the holder unit on which the light-transmitting pressing member is mounted is raised and lowered in the vertical direction;
wherein pressing the plurality of electronic components arranged on the substrate by the pressing unit with a light-transmitting pressing member in a vacuum atmosphere inside the vacuum chamber, and at the same time, bonding an electronic component to a substrate by irradiating a laser beam into the vacuum chamber through the light-transmitting pressing member.

2. The compression-type laser reflow apparatus with a vacuum chamber of claim 1,
wherein an O-ring made of an elastic material having a predetermined thickness is further equipped at a contact area between the laser beam irradiation hole of the vacuum chamber and the holder unit; and while maintaining the state in which the laser beam irradiation hole and the holder unit are in contact with the O-ring, the holder unit and the light-transmitting pressing member seated on the holder unit is vertically raised and lowered by the pressing unit.

3. The compression-type laser reflow apparatus with a vacuum chamber of claim 1,
wherein an inlet through which the substrate is introduced is formed at one side of the vacuum chamber, and an outlet through which the substrate is drawn out is formed on the other side opposite to the inlet; and the inlet and outlet are equipped with shutters, respectively, so that the inner space of the vacuum chamber is selectively opened and closed by the shutter.

4. The compression-type laser reflow apparatus with a vacuum chamber of claim 3,
wherein a carrier chuck is equipped in the vacuum chamber for transferring the substrate drawn in from the inlet to the laser irradiation hole directly below the laser irradiation hole, performing laser reflow, and then transferring the laser reflowed substrate to the outlet to take it out of the vacuum chamber.

5. The compression-type laser reflow apparatus with a vacuum chamber of claim 1,
wherein two or more laser modules are equipped above the vacuum chamber, and the laser beam irradiated from the laser module is overlappingly irradiated on a plurality of electronic components arranged on a substrate through a light-transmitting pressing member.

6. The compression-type laser reflow apparatus with a vacuum chamber of claim 1,
wherein the holder unit has a circular or left-right symmetrical regular polygonal shape with a laser beam irradiation hole formed in the center when viewed from a plan view; arms are coupled to edge points that divide the outline into three equal parts based on the center point of the holder unit, and each pressurization unit is connected to the arms.

7. The compression-type laser reflow apparatus with a vacuum chamber of claim 3,
wherein a reel-to-reel-type protective film transfer unit for transferring the protective film wound to one side while unwinding the roll-shaped protective film is further provided on the outside of the inlet and outlet of the vacuum chamber in order to prevent fumes generated during laser bonding from adhering to the bottom surface of the light-transmitting pressing member.

8. The compression-type laser reflow apparatus with a vacuum chamber of claim 7,
wherein the shutter waits in a state below the inlet or outlet; when the inlet or outlet is closed, the shutter slides upward and blocks the inlet or outlet while the protective film is sandwiched in the inlet or outlet so the inside of the vacuum chamber is closed confidentially.

9. The compression-type laser reflow apparatus with a vacuum chamber of claim 8,
wherein the vacuum pump is driven to form a vacuum atmosphere inside the vacuum chamber after the shutter is closed.

* * * * *